US005381099A

United States Patent [19]

Balousek

[11] Patent Number: 5,381,099

[45] Date of Patent: Jan. 10, 1995

[54] STREAK DETECTION FOR INK-JET PRINTER WITH OBNICALLY CONNECTED SEGMENT PAIRS

[75] Inventor: Andrew J. Balousek, Berkeley, Mich.

[73] Assignee: Unisys Corporation, Blue Bell, Pa.

[21] Appl. No.: 24,999

[22] Filed: Mar. 2, 1993

[51] Int. Cl.[6] .............................................. G01R 31/02

[52] U.S. Cl. ..................................... 324/555; 324/713; 324/718

[58] Field of Search ............. 174/11 R; 324/524, 555, 324/691, 693, 713, 718; 73/40; 346/75, 140 R

[56] References Cited

U.S. PATENT DOCUMENTS

| | | | |
|---|---|---|---|
| 3,886,564 | 5/1975 | Naylor, III et al. | 324/464 |
| 4,027,238 | 5/1977 | Loch | 324/694 |
| 4,196,625 | 4/1980 | Kern | 73/304 R |
| 4,313,087 | 1/1982 | Weitzen et al. | 324/718 |
| 4,631,550 | 12/1986 | Piatt et al. | 346/75 |
| 4,763,054 | 8/1988 | Bundy | 324/161 |
| 5,162,817 | 11/1992 | Tajika et al. | 346/140 R |

*Primary Examiner*—Kenneth A. Wieder
*Assistant Examiner*—Christopher M. Tobin
*Attorney, Agent, or Firm*—John J. McCormack; Mark T. Starr

[57] ABSTRACT

Disclosed is a combined fluid-stream misdirection detector and fluid-level flow detector on a single printed circuit board; each detector comprising a pair of parallel printed circuit segments adapted to be "shorted" by interposition of conductive liquid and coupled to register this event in an associated detect-logic stage.

20 Claims, 6 Drawing Sheets

TRANSPORT

STREAK DETECTION FOR INK-JET PRINTER WITH OBNICALLY CONNECTED SEGMENT PAIRS

This invention relates to fluid stream apparatus, and more particularly, to means for detecting misdirection of a fluid stream.

BACKGROUND, FEATURES

In providing and using fluid stream apparatus it occasionally happens that the fluid stream is misdirected, e.g. above, or below or beyond a prescribed target: at times because it is activated at the wrong time (in the case of a moving target or to the wrong place. Workers are interested in detecting such conditions; e.g. when and where they occur. An object of this disclosure is to facilitate such detection, doing so automatically.

The misdirection of such a stream can also call for provision of spillage-collection means (e.g. a suitable receptacle placed and adapted to catch and collect the misdirected fluid. Another object of this disclosure is to so provide for such collection.

And, workers are at times interested in determining the mass of so-collected misdirected fluid (e.g. automatically monitoring its accumulation). A further object hereof is to so monitor the accumulation of the so-collected misdirected fluid mass, and to also preferably provide an automatic indication thereof—especially when the collection means is subject to overflow and it is useful to automatically indicate that fact.

An example of such fluid stream is that projected from an ink-jet printer, particularly where passing documents are to be printed and jet-misdirection/-mistiming can result in "streaking" of documents.

Other malfunctions can cause ink jets to be projected before, or after, an entire subject document passes the print station; or to be projected above the document (e.g., when check height is less than "standard")—all such resulting in ink jets projected with no document to intercept them ("bypass" or "streaking"). In other cases a pin hole etc. may exist, or be formed, in a document, allowing an ink jet to be projected through the document ("thru-streaking").

Any, and all, such conditions can be characterized as "streaking", and are troublesome (e.g., often resulting in unacceptable print results, not to mention creating a messy pool of ink on the document transport track in the printer, etc.)—and are obviously to be avoided or terminated (and corrected) as soon as possible. This invention is directed toward automatically detecting such "streak" conditions and providing resultant indicator signals (e.g., alarm, error-signal to stop printing action).

A typical ink jet printer system consists of 128 tiny individual jet nozzles delivering ink to inscribe a document as it passes by the print head. As mentioned, the possibility of "streak-errors" occurring in the print system calls for failure detection measures. My subject streaker detection system offers a remedy, detecting errors involving erroneous Jetting of ink continuously from one or more jet nozzles (i.e., "streaking")—"-streaking" being understood to also include Jet-ink projected through the document material, (e.g., through a pin-hole, being leaked-through when a check is being printed).

An object hereof is to address at least some of the foregoing problems and to provide at least some of the mentioned, and other, advantages and features.

BRIEF DESCRIPTION OF THE DRAWINGS

These and other features and advantages of the present invention will be appreciated by workers as they become better understood by reference to the following detailed description of the present preferred embodiments which should be considered in conjunction with the accompanying drawings, wherein like reference symbols denote like elements.

The methods and means discussed herein, will generally be understood as constructed and operating as presently known in the art, except where otherwise specified; likewise all materials, methods, devices and apparatus described herein will be understood as implemented by known expedients according to present good practice.

Figure 1:
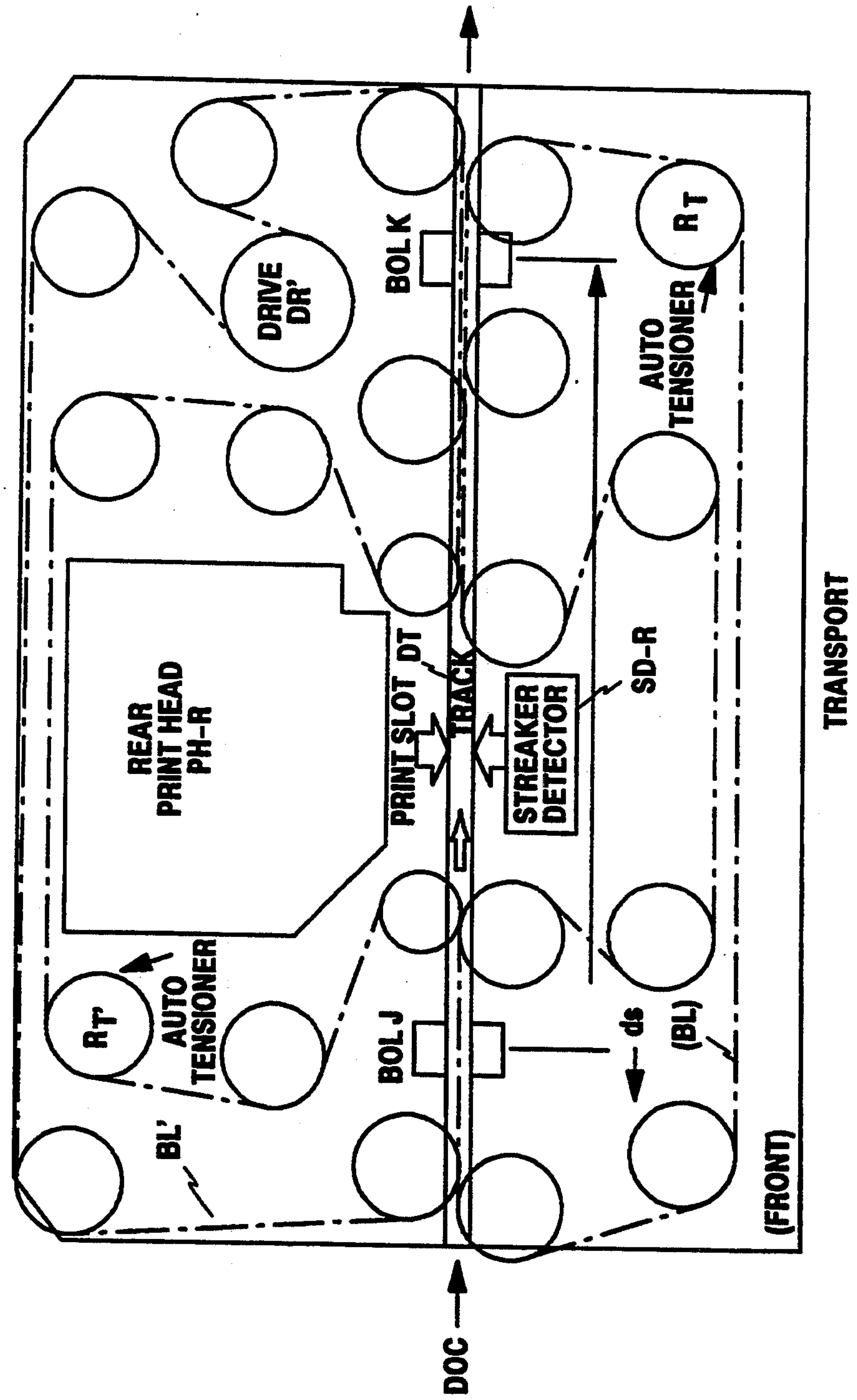
FIG. 1 is a schematic plan view of one (rear) print head in operative association with means for transporting documents therepast and a streak detector means embodiment according to this invention.
Figure 2:
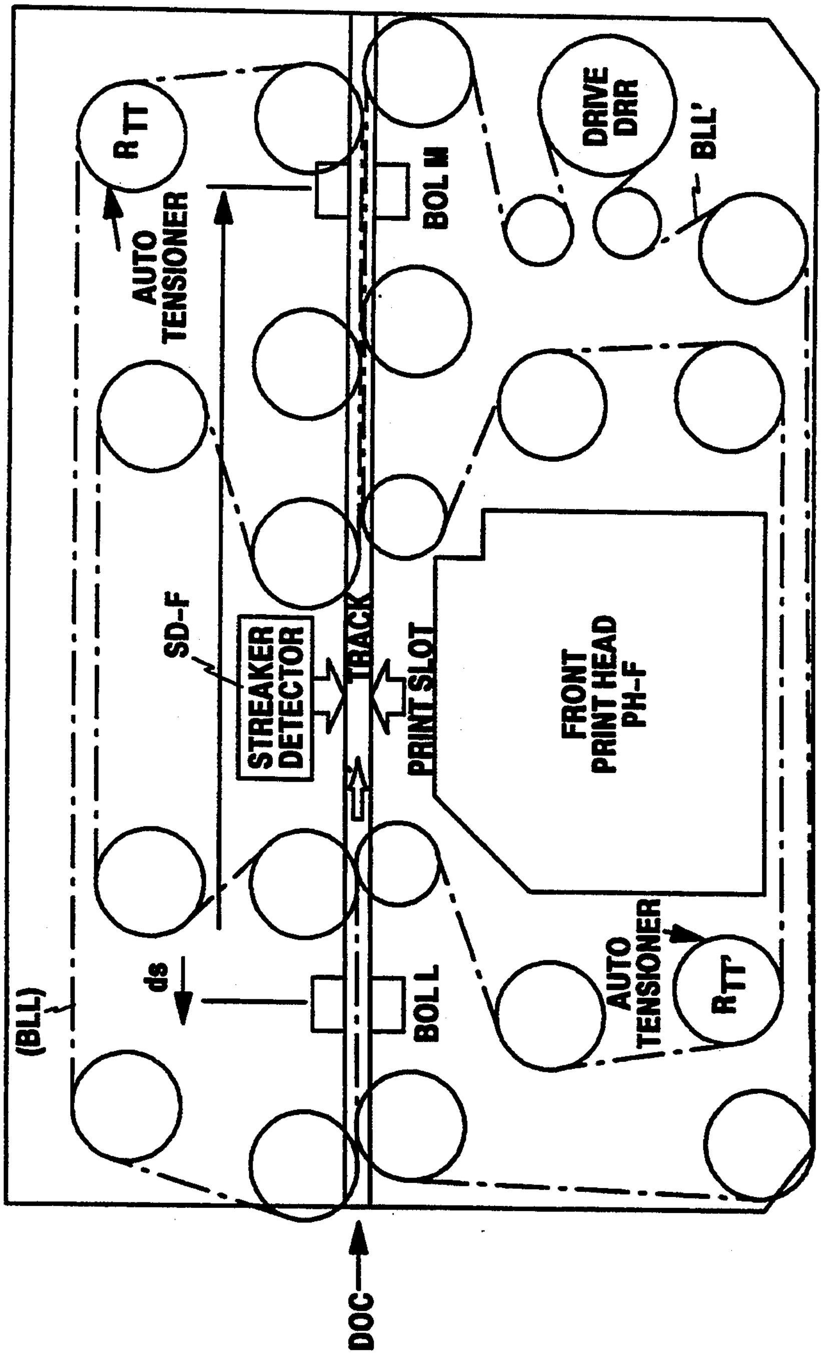
FIG. 2 is a like view of a second (front) print head in similar association.
Figure 3:
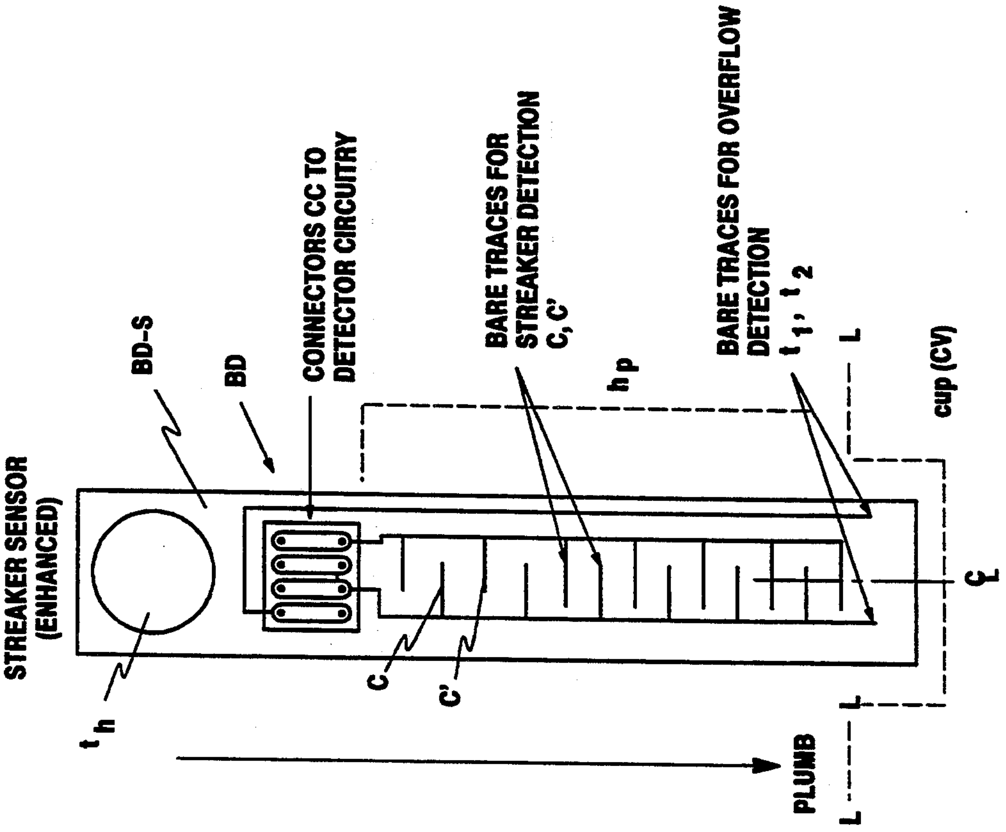
FIG. 3 is a frontal schematic showing of a streak-detecting circuit board embodiment useful in the arrangements of FIGS. 1, 2.

Transport (FIGS. 1, 2, 3)

FIG. 1 shows a very simplistic schematic plan view of a document transport path (track DT, along which document is translated between a pair of transport belts BL, BL' as known in the art) past a REAR print station, (e.g. to endorse documents) where an ink jet print head PH-R will be understood as conventionally arranged and controlled to project one or several jets of conductive ink across the track DT (cf. print-site defined by "Print-Slot" arrow, with belts BL, BL' directed away from this print site to allow this). Here, one may assume that documents are continuously translated past PH-R at about 300 in/sec or less.

According to a feature hereof, a streak detector SD (e.g. SD-R, FIG. 1) is provided opposite the Print-Slot, to intercept "erroneous" misdirected Jet ink and detect its incidence. Each detector SD preferably comprises a circuit board BD (e.g. see FIG. 3) disposed in a housing H (e.g. see FIG. 4) having a slot H-SL (e.g., preferably about 100–150 mils wide) to pass the multi-jet train (along common jet-axis Ax) when they project beyond track DT (e.g. when no document is interposed). According to a related feature, "streak-detector" board BD is provided within H to intercept this jet train—e.g., located about one inch past track DT.

More particularly, transport belts BL, BL' are arranged, as known in the art to be driven at like speeds (e.g. by Drive roll, BL' is friction-driven by BL) and are directed by idler rolls etc. to conjunctively, pull-in each document to be printed (see DOC, arrows) at an entry section DT-E of track DT, and to similarly thrust the document out of the intermediate print-site (adjacent Print Slot) in an exit section DT-X, and beyond. This "print-site" section of track DT is arranged to be 4' (between nip of rollers at either side of "Print Site"), or less than the length of the shortest document to be printed (here 5.25'), so that the belts in the exit-section DT-X will grip the on-coming document well before those in the entry-section release it. A tension-adjust roll RT, RT' may also be provided for each belt (to adjust belt tension) as known in the art.

Preferably, a set of document detectors BOL are also provided along track DT to sense document-entry (e.g. BOL-J where leading edge of each document interrupts a beam-of-light to enable "Print-Start" and calculate document length for print timing) as known in the art and to sense document exit (e.g. BOL-K, e.g. to also signal END-Print)—being separated by a prescribed distance ds. Detectors BOL can also be used to detect "folds", "bends", wrinkles etc. in a document which shorten it (or underlength documents, or "missing documents") as known in the art (e.g. for a "standard-length" document, being driven at "SP" in./sec., the document's trailing-edge should uncover BOL-J "x" seconds after its leading-edge interrupts BOL-K).

FIG. 2 shows a front printing assembly (to jet print on the other, "front", side of a document) that may be disposed up-stream (or down-stream) of the Rear printing assembly in FIG. 1, and that preferably, duplicates it, essentially (e.g. see related call-outs for belts BLL, BLL', front Print Head PH-F and associated streak-detector assembly SD-F, etc.) in structure and operation.

The preferred streak-detect shroud or housing H (see FIG. 4), or an equivalent, is provided to, essentially, position and enclose detector board BD, and includes an elongate entry-slot H-SL disposed and configured to entrain the jet-pattern vs. the board BD within (e.g. shroud H will intercept any jet that is "excessively-misaligned", or streaking. Housing H may be (removably) affixed and aligned opposite the Print-Slot as known in the art. Housing H also preferably contains a collection-vessel CV (see FIG. 3; details not shown but known in the art) to accumulate ink that drips down from board BD as mentioned elsewhere.

FIG. 3 shows, in schematic front elevation, a preferred streak detecting embodiment circuit board BD, for either detector SD, presenting an array of spaced "horizontal" conductors c, c' (to be aligned transverse to "PLUMB" direction) adapted to intercept the ink stream projected past a document. (i.e., along jet axis) by (one or more) "streaking" (e.g. partly-plugged) jets and to automatically provide output ( s ) to signal such malfunctions.

More particularly, the illustrated facing side of board BD will be understood as preferably provided with a pair of interleaved "half-ladder" conductors (cf. +half-ladder ta and opposed minus half-ladder t'b e.g. in FIG. 3, a "plus half-ladder" could include "rungs" C, and a "minus half-ladder" include "rungs" C') these being disposed to intercept all prescribed streaking ink jets of a subject print head PH; e.g., this side of BD being positioned opposite head PH, and beyond the intervening document transport track DT. Typically, slot H-SL will be cut into the housing H to define the locus of all misdirected jets received by half-ladders ta, t'b. Housing H, with BD therein, is disposed So its slot H-SL lies opposite the ink jet orifices (so all misdirected jets will pass through H-SL if there is no intervening document).

Board BD is placed facing slot H-SL (e.g., about 1" beyond), .with its facing side relatively vertical and facing the jets of head PH, this side having its ladder pattern positioned medially to intercept all jets passing through H-SL; (with ladder-center line C/L aligned with that of the jet orifices, or axis Ax; and with the height hp of the ladder pattern spanning the "throw" of all jets, with some leeway on each side of the C/L).

The horizontal "rungs" c, c' of each half-ladder ta, t'b will preferably be identical, and spaced a prescribed varying separation rd from adjacent opposing rungs.

Thus, a first half-ladder ta may comprise the horizontal rung-conductors c' while the other, like, second half-ladder t' comprises the other horizontal rung-conductors c, interleaved between each rung c'. Each half-ladder is terminated conductively at a respective upper connector plate cc, which is coupled to the detection circuit DL (see FIG. 5; e.g. DL is preferably affixed on the opposite face of board BD, as known in the art). A top-hole Th is provided as a finger-grip.

As workers can visualize, a "streaking" misdirected ink Jet. (e.g., firing its conductive stream erroneously when no document intervenes—remember the subject ink must be at least somewhat conductive), will pass through slot H-SL and strike the ladder pattern at some respective height level thereon, approximately along axis C/L (Ax). The ladder pattern is arranged so that a substantial "blob" of the so-incident conductive ink will rather quickly flow down, gravity-urged (in PLUMB direction; assume documents advanced along DT relatively "horizontal", or normal to "PLUMB"), to connect at least two opposing (opposed-potential) rungs c, c' (e.g., well before the ink can run-off and/or dry) and so cause conduction (a "short") between the half-ladder patterns, t, t'. This causes associated detect stage DL, coupled thereto, to register this "short" and provide related output (e.g., as detailed below re FIG. 5).

Preferably, the half-ladder patterns ta, t'b, each comprise like bare conductor traces (e.g., prefer tinned copper traces about 10–15 mils wide, printed on board BD as well known in the art) as the detect-array so that, when the conductive ink flows to short-out any pair of superposed rung traces, the detection circuitry can register this event. The detection circuitry is adapted to sense the presence (or absence) of such a shorting-current and to generate a corresponding logic signal, or like output, as known in the art.

As stated, the opposed-rung-separation distance, rd, is preferably varied here; principally to reduce sensitivity to ink-impact when "under-height" documents are being printed. Thus, if a certain "standard" document-height Hd is assumed (see FIG. 3, Hd approximating hp), then an under-height document might allow the "upper" ink jets (above this document) to impact the board face at the upper portion of the ladder pattern t, t' and "erroneously" indicate "streaking". To reduce the likelihood of this, the upper rungs can be sufficiently separated (e.g., here about 300 mils—vs 200 mils for "lower" rungs) to reduce detection sensitivity there; thus, the detect logic can be arranged to discriminate between short conditions occurring only in the "upper" ladder regions, and "other" short conditions, as known in the art.

The pattern of these bare traces is preferably the illustrated "opposed, interleaved rungs" of two half-ladders as above mentioned (and shown in FIG. 3); although variations are feasible in some cases.

For example, with a printed circuit pattern of this "ladder type" (as FIG. 3), the "upper" rung-separation could be about 300 mils and the "lower" about 200 mils.

This, evidently, can give a two-fold height-discrimination capability to the detector system—e.g., so an "upper-streaking" must traverse 300 mil rung separation—e.g. assume here that ink will dry somewhat before completing this drip-distance. Alternatively, timer/filter means may be used to tell whether shorting ink has traveled 200 mils or less, vs 300 mils or more. As workers will appreciate, in certain cases, one may even make a 3-fold (or 4-fold, etc.) discrimination, using three different rung separations (or more).

By contrast, visualize another "ladder" pattern where the inter-rung separation is made uniform (not varying as in FIG. 3); e.g. this can be suitable where no "height-discrimination" is wanted.

Thus, detection sensitivity, in general, may be controlled by varying the inter-rung separation, rd; e.g., we have found that for arrangements as described above, a separation rd of about 50 mils or less gives too high a sensitivity (e.g., shorts occur from tiny ink droplets, or even dust or moisture deposits); whereas about 350+mils or more makes sensitivity too low; thus, we prefer the mentioned 200 mil (±20%) rung-separation for most applications and embodiments of the sort described.

In any event, the opposed conductors (rung-traces) of such a "streak detector" will be arranged in a pattern so that when sufficient flowing ink provides a conductive path (sufficient rise in conductivity) between two opposite-polarity rung-traces (e.g. C and C'), the detection circuitry will sense any such short. The traces on the front side of circuit board PC face the subject print head PH jets to accommodate this detection of "streakers"; while a detect-circuit DL (FIG. 5) may be located on the other (back) side of PC.

The configuration of the pattern and the opposed-conductor separation distance (e.g., rd, FIG. 3) will, of course, determine the "sensitivity" of streak detection. For instance, assuming a certain machine environment and document type (e.g., here, assume a check-sorter/-printer array like the Unisys DP-1800 moving checks past the print station at about 1800 checks/min, and using an ink jet printer with a print head about 1.25" high containing about 128 separate ink jet nozzles; each nozzle about 2 mils in diameter, with a 10 mil Jet separation), one will prefer a "ladder" pattern like that in FIG. 3. One should set rung separation (rd) large enough to avoid "accidental shorts" (e.g., from a random speck of dust; here, more than about 10–50 mils is advised); yet small enough to give reasonably high sensitivity (e.g., allow sufficient ink mass to flow, without drying, to give sufficient inter-rung conduction; here, less than about one-half inch is advised). With this embodiment, a separation rd of about 100–250 mils has been found even more satisfactory. [E.g. assume a ladder height hp of about 1.5" (or more) with each half-ladder having rungs about one-half inch apart on either side of center line C/L.]

Other Streak-Conductor Patterns

Evidently, whatever streak-conductor pattern is used, it should present opposed pairs of conductors across the target jet axis to be able to intercept such erroneously-projected ink blobs, when they drip down sufficiently under gravity, preferably as "interleaved half-ladders". In cases like those above described (jets across horizontal document track) this means horizontally-disposed conductor segments, like the opposed rungs in FIG. 3—not "vertical" as described below.

Figure 6:
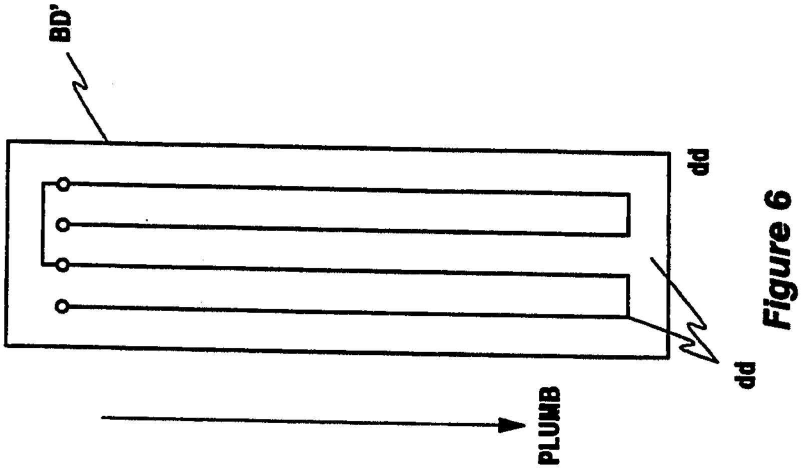
FIG. 6 shows a modified embodiment in the manner of FIG. 3.

FIG. 6 represents a set of vertically-aligned (parallel to "PLUMB") opposed conductors, spaced (in opposition) at separation distance dd. I have tested such arrays with conductor-separations of 50, 40, 30, 20 and 10 mils [aligned with the center-line of the multi-jet ink paths (C/L, as in FIG. 3)]; but none were effective or adequate for streak detection ("short-incidence"; tested on purely-vertical, rectilinear versions).

Auxiliary Short Detector

The arrangement of FIG. 3 may be used on a wider PC board, on which the detect-conductor elements (as in FIG. 3) are centrally placed (i.e., two half-ladders) and are flanked by a board expanse, on which is placed one (or several) other pairs of half-ladders e.g., disposed to one side of half-ladders ta, t'b to detect when/if a jet stream wanders sidewise to "short" the flanking set of half-ladders. Another such array may be placed on the other side of t, t'; one may even provide different detect-heights thereby.

Detect Circuit

Workers will understand various ways wherein the streak-detect output (short-occurrence) may be detected and registered (e.g., used to control ink-jet printer, document transport, etc.). One preferred form of detect circuit is given in FIG. 5 [here, combined with other circuits; e.g., for "overflow" detection].

Figure 5A:
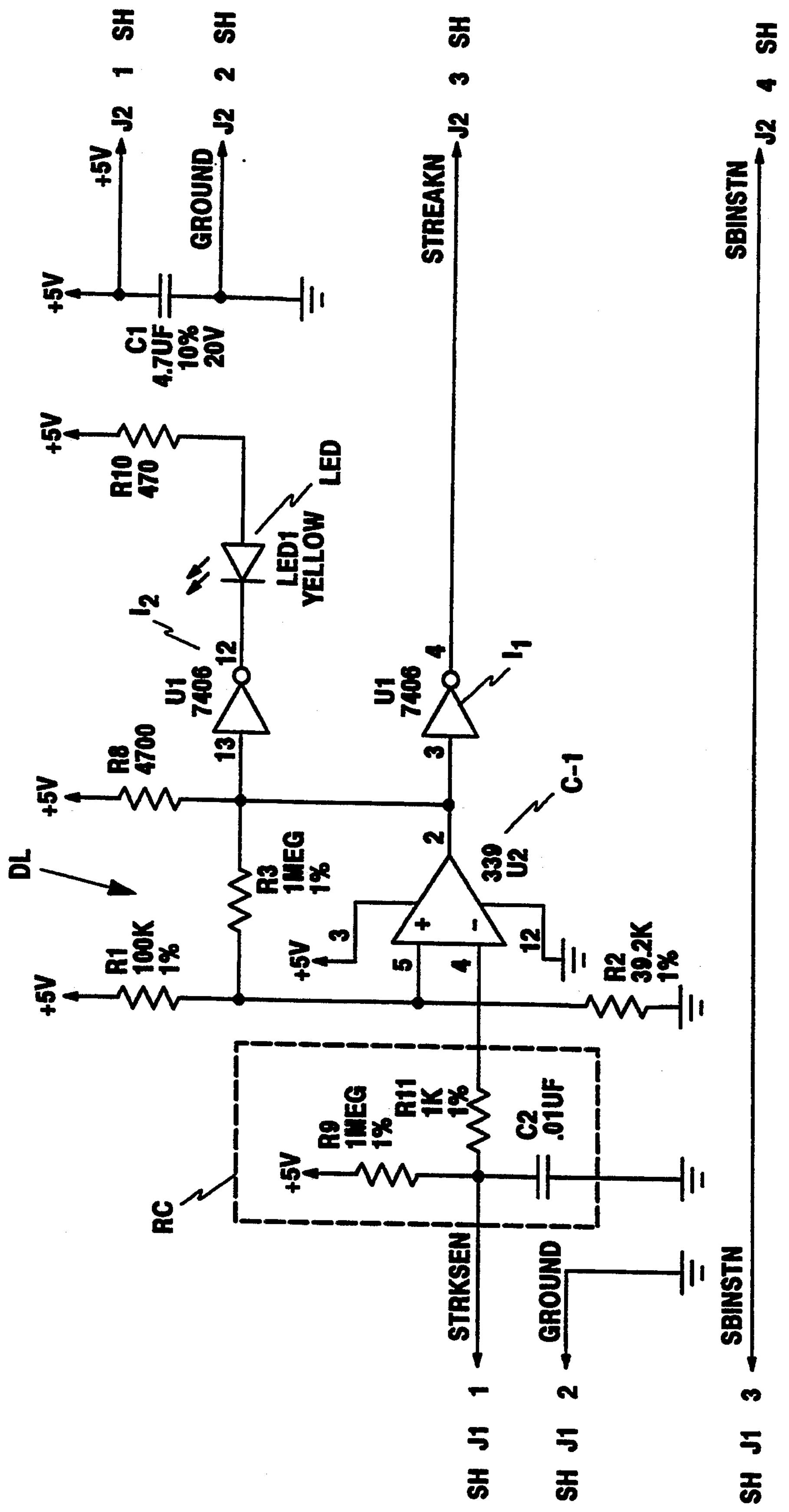
FIG. 5 is a schematic detect logic circuit embodiment apt for use with such circuit boards.
Figure 5B:
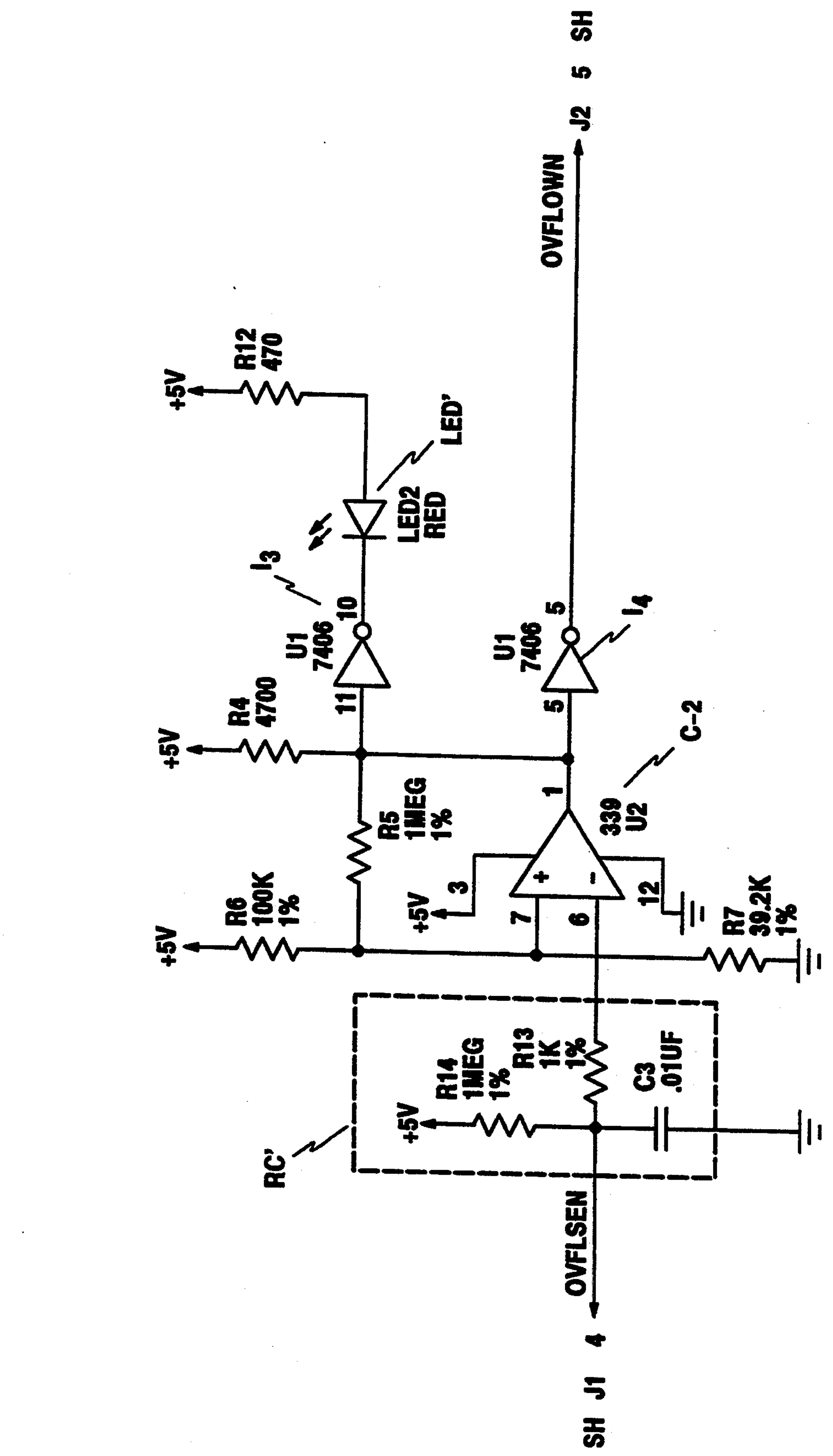

In FIG. 5, the INPUT/OUTPUT signals are arranged as follows:

INPUT signals (on left, all "J1"):

- J1-1: from streak-detector, indicating "streak" (short between ladder-rungs) if "sufficient" drop in resistivity to "unbalance" comparator stage C-1 ("STRKSEN");
- J1-2: Ground; and to interface with printer.
- J1-3: to PR interface, signal (SBINSTN, or "Hi") indicates that detector PC board is properly installed and working.
- J1-4: signal from overflow-detect (pr. ckt) conductors indicates "overflow level" if sufficient drop in resistivity to "unbalance comparator stage C-2 (i.e. "Hi", or OVFLSEN).

OUTPUT (all "J2" terminals):

- J2-1: Power to PC board
- J2-2: Ground; in common with J1-2 and PR interface.
- J2-3: "Streak-detected" ("STREAKN", or "Lo" signal as explained below ("Hi" indicates "No streak").
- J2-4: "Hi" indicates "PC board installed", as at J1-3; but "Lo" indicates "Not installed".
- J2-5: "OVFLOWN" (or "Lo") indicates "Overflow" condition—but "Hi" indicates "No overflow", as explained below.

Operation

Typical operation of this embodiment (FIG. 3 ladder pattern with FIG. 5 circuit) would be as follows.

A "significant" streak-condition occurs, leading to a serious "short" between opposed ladder rungs, with a large blob of conductive ink reducing inter-rung conductivity radically and developing a streak-sensing condition ("STRKSEN" or low-resistance path to ground at J1-1) to an associated pin #4 of a comparator stage C-1. Comparator C-1 constantly compares the input on its pin #4 to that on pin #5: normally they are approximately equal, but a streak-caused "short" (e.g. to ground) will drop the pin #4 input low enough (compared with pin #5, "reference input") to unbalance C-1, whereupon C-1 will issue a "High" output to invertor $I_1$, and thence a "low" to output pin J2-3 ("STREAKN"). This output ("STREAKN") is applied to the printer control and associated software to register this error (Streak) condition, whereupon an appropriate response is automatically invoked (e.g. printer stopped; indicator to operator; head-clean cycle invoked, e.g. to remove dirt etc. in jet nozzle;—recurrence of streak condition may invoke replacement of print head).

Comparator stage C-1 preferably comprises an LM-339 type comparator or the like, plus associated circuitry. C-1 inputs #4, #5 may be set to a "normal" reference voltage (e.g. about 3.5–4 volts, set by +5 v terminal as adjusted by impedance network, as known in the art). Varying this reference input to pin 5 can vary sensitivity (i.e., threshold). When C-1 is unbalanced by a streak-short, its output goes "High" to indicate "streak" and is inverted at $I_1$, then, as "low" passed to output at J2-3. Preferably, an input circuit R-C is also used to filter out low-level input on J1-1 (e.g. noise spike or like minor drop in resistance, e.g. from tiny trickle of ink or moisture between rungs, not amounting to a full-fledged "streak condition", as here defined). Here, such a "noise" condition might drop the pin #4 input from about 4 v to about 3.5 v; versus about 0.8–1.2 v or less for a true "streak" condition.

This "STREAKN" output ("LOW", or less than 2–3 v on pin J2-3) will persist, of course, until there is too little conductive ink between rungs to sufficiently drop pin #4 input (e.g. ink dries or runs off), whereupon C-1 will again be "balanced" and J2-3 output revert to "high".

Preferably, the C-1 output is also used to activate an "internal streak-indicator", such as at the "Yellow LED" of FIG. 5. This indicator may be useful where the system indicates "Streak", but an operator wants to double-check to see whether intra-machine error caused this; so inspection of the detect circuit unit would show the Yellow LED lit, indicating that a genuine "streak condition" likely occurred. Such can also be done during Test/Set-up where a blob of conductive test-ink is placed between rungs.

Proper installation of the PC Board BD is indicated by an associated signal, "SBINSTN", (or "High") on pin J1-3, coupled to output (e.g. to print control) via pin J2-4.

According to a related feature, "hyper-sensitivity" (e.g., "accidental shorts", such as from an ultra-brief jet-burst, not amounting to a genuine "streak" condition) can be compensated for, if not actually prevented, by arranging for detect stage DL, and associated controlling software, to require that a streak-indicating pulse S-S from the ladder pattern (e.g., to J-11, FIG. 5) must persist beyond a prescribed minimum time td (e.g., using a delay network or a pulse-width filter) and/or to require (logic) that such a pulse be present when sampled-for again after a prescribed interval tc (e.g., 5 seconds has been found suitable) as workers will understand.

Collection of Streak-Ink

Figure 4:
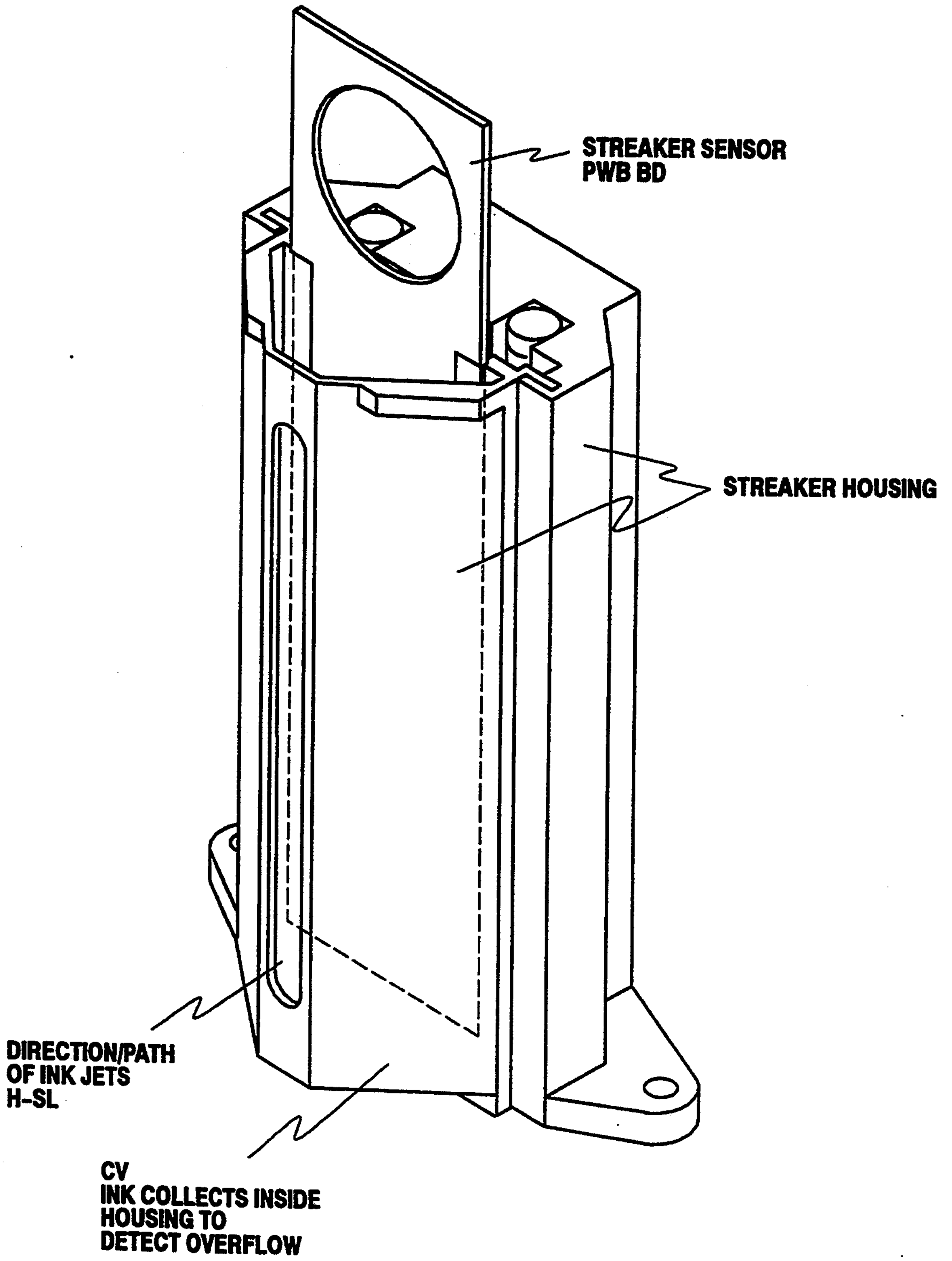
FIG. 4 is a schematic front elevation of a preferred housing embodiment for boards as in FIG. 3.

As depicted schematically in FIGS. 3, 4, any jet ink passing through slot H-SL (e.g., that strikes the front of board BD in FIG. 3) is preferably collected in a sump-vessel CV and be periodically emptied therefrom. As workers realize, it will be a convenience for an operator to be automatically reminded that sump vessel CV needs to be emptied (i.e., is "too full"). For this purpose, I prefer to provide a "sump-full" detector on the same (front) face of the streak-detect board (e.g., BD above), so that the board may be placed (suspended) in vessel CV whereby rising of sump contents (conductive ink from jets) above a test-level L—L will cause the sump-full detector to automatically indicate such.

FIG. 3 shows a preferred embodiment of such a detector, comprising a pair of rectilinear parallel vertical overflow-conductors t1, t2, (preferably, one may also support rungs, e.g. C; and preferably as vertical copper traces printed upon substrate BD-S of PC board, as for half-ladders ta, t'b) input to detect-logic stage DL, with both conductors extended down beyond level L—L, and terminated (at cc) to define a prescribed "sump-full" level (see L—L, FIG. 3—this level L—L being kept low enough that it will not short-out any opposed-rungs c, c' (of streak detector). Vertical overflow conductors t1, t2 will preferably be uniformly separated (terminal tabs may also be provided on each). And, as mentioned, one such conductor t1 or t2 may simply comprise the "trunk" for a set of rungs; e.g. ta for rungs c', but extended below level L—L.

Detect circuitry in detect logic stage DL (FIG. 5 is example) is accordingly arranged to sense the presence (absence) of sump-fluid above level L—L as before described, or otherwise as known in the art (cf. onset of signal indicating conduction from t1 to t2 via conductive ink level in vessel CV); e.g., indicating over-accumulation of ink in housing of detector, and well before risk of "overflow". Thus, detect-traces t1, t2 are configured and separated so that when the fluid level of the ink rises to electronically couple traces t1, t2, a "sump-full" condition is automatically detected and registered. The height of the bottom (free) ends of traces t1, t2 from the bottom of the circuit board will affect the level of detection.

Overflow Operation

Typically the "overflow" detector embodiment (e.g. see FIG. 3) is, according to an enhancement feature, used in conjunction with the streak detector (conductor-rungs c, c') and uses one or more like flanking conductors, preferably on the same side of board BD, along with similar detect circuitry, preferably incorporated with DL.

Here, a comparator stage C-2, like C-1 above (FIG. 5) is similarly set to normally compare the "overflow" input (on J1-4 to pin 6) with a reference input (pin 7, see +5 v supply). When a "true overflow" condition occurs ("OVFLSEN" on J1-4), the pin 6 input will drop radically (overflow shorting to GND, between ends of vertical conductors t1, t2 in FIG. 3), causing a "High" output from C-2, this being inverted (at $I_4$) to appear as a "Low" output on J2-5. This output also activates a "Red LED" as before, and is noise-filtered by an associated R-C input circuit (RC') as before. Either R-C input network can obviously be used to adjust detector-sensitivity (i.e. lower threshold), as known in the art. The overflow-detecting output (on J2-5) is preferably used to automatically shut down the associated printer PR, since it indicates a condition that can be very dangerous (e.g. causing short, possibly fire inside machine) and hazardous to machine operation.

In conclusion, it will be understood that the preferred embodiments described herein are only exemplary, and that the invention is capable of many modifications and variations in construction, arrangement and use without departing from the spirit of the claims.

For example, the means and methods disclosed herein are also applicable to other related jet-stream arrays. Also, the present invention is applicable for enhancing other ways of monitoring conductive fluid streams and related arrangements.

The above examples of possible variations of the present invention are merely illustrative. Accordingly, the present invention is to be considered as including all possible modifications and variations coming within the scope of the invention as defined by the appended claims.

What is claimed is:

1. A method of detecting streaking and like erroneous fluid projection on any arrangement adapted to project one or more conductive fluid streams along prescribed stream axes onto selected portions of a subject target, said method comprising:

placing a non-conductive substrate means in line with said axes, behind the position of the subject target and spaced therefrom, said substrate means being adapted to intercept fluid that misses said target;

disposing at least one pair of spaced conductor segments on a first surface of said substrate opposite said streams to intersect all said stream axes, said segments being arranged and adapted so that opposed portions thereof will intercept said streaking and like erroneous fluid projection and be ohmically connected thereby when the conductive fluid is gravity-urged down said first surface;

coupling detection means to said pairs of segments to detect and register the ohmic connection of said segments resultant from said streaking and like erroneous fluid projection; and, indicating said streaking and like erroneous fluid projection.

2. The method of claim 1, wherein each said pair of conductor segments comprises a pair of like spaced segments that are similarly placed to bracket the loci of all said axes, said segments being configured to cross these loci back and forth, together, so that impingement of any single stream on said substrate will cause its conductive liquid to quickly run down, gravity-urged, and connect said segments; said substrate means being disposed relatively vertically to induce said gravity urged flow.

3. The method of claim 1, wherein a first one of each said paired segments comprises conductor laid on said substrate, centered along said respective axes and to cross and re-cross said axes as it extends down therealong, the other segment of each said pair being similarly configured, to maintain a relatively uniform separation distance from its opposing first segment.

4. The method of claim 3, wherein each said first segment comprises a "half-ladder" configuration, with a trunk-section extending relatively parallel with said axes plus identical rung-sections projecting transversely, from said trunk-section to cross said axes; said other segment being a mirror image of this first segment, but dispersed along the other side of said loci with its rung-sections interleaved between respective rung-sections of the first segment.

5. The method of claim 4, wherein said substrate means is mounted in vessel means adapted to collect drip of conductive liquid and wherein said substrate also has a pair of parallel spaced conductors disposed thereon and arrayed and adapted to detect said liquid in said vessel.

6. The method of claim 4, wherein said segments and said conductors are printed on said substrate means which is a printed circuit board.

7. The method of claim 4, wherein each said "half-ladder" configuration is adapted for also indicating two or more height-levels along said locus according to the respective inter-rung separation distance and associated liquid-drip time for each level.

8. The method of claim 7, wherein two said levels are so detected.

9. The method of claim 2, wherein each said pair of segments comprises a parallel pair of "Z-shaped" printed circuit conductors.

10. The method of claim 3, wherein each said pair of segments comprises a parallel pair of "S-shaped" printed circuit conductors.

11. An arrangement for detecting streaking and like erroneous fluid projection in an arrangement adapted to project one or more conductive fluid streams along prescribed stream axes onto selected portions of a subject target means, said detection arrangement comprising:

non-conductive substrate means placed in alignment with said stream axes, behind the position of the subject target and spaced therefrom, said substrate means being adapted to intercept fluid that misses said target;

at least one pair of spaced conductor segments disposed on a first surface of said substrate opposite said streams to intersect all said axes, said segments being arranged and adapted so that opposed portions thereof will intercept said streaking and like erroneous fluid projection and be ohmically connected thereby when the conductive fluid is gravity-urged down said first surface;

detection means coupled to said pairs of segments to detect and register the ohmic connection of said segments resultant from said streaking and like erroneous fluid projection; and, indicating means to indicate said streaking and like erroneous fluid projection.

12. The arrangement of claim 11, wherein a first one of said paired segments comprises conductor means laid on said substrate, and disposed on a first side of said axes, and arranged to cross and re-cross said axes as it extends down therealong, the other paired segment being similarly configured, and disposed on the other side of said axes so as to maintain a relatively uniform separation distance from its opposing first segment.

13. The arrangement of claim 11, wherein each said pair of conductor segments comprises a pair of like spaced segments that are similarly placed to bracket the loci of all said axes, said segments being configured to cross these loci back and forth, together, so that impingement of any single stream on said substrate will cause its conductive liquid to quickly run down, gravity-urged, and connect said segments; said substrate means being disposed relatively vertically to induce said gravity urged flow.

14. The arrangement of claim 13, wherein each said first segment comprises a half-ladder configuration, with a trunk-section extending along beside said loci and identical rung-sections projecting transversely therefrom to cross said loci; said other segment being a mirror image of this first segment, but dispersed along the other side of said loci with its rung-sections interleaved between respective rung-sections of the first segment.

15. The arrangement of claim 14, wherein said substrate means is mounted above vessel means adapted to collect conductive liquid and wherein said substrate has a pair of parallel spaced conductors disposed thereon and arrayed and adapted to detect said liquid in said vessel.

16. The arrangement of claim 15, wherein said segments are printed on said substrate, which is a printed circuit board.

17. The arrangement of claim 15 wherein each said "half-ladder" configuration is adapted for also indicating two or more height-levels along said locus according to the respective inter-rung separation distance and associated liquid-drip time for each level.

18. The arrangement of claim 16, wherein two said levels are so detected.

19. The arrangement of claim 13, wherein each said pair of segments comprises a parallel pair of "Z-shaped" printed circuit conductors.

20. The arrangement of claim 13 wherein each said pair of segments comprises a parallel pair of "S-shaped" printed circuit conductors.

* * * * *